US009802233B2

(12) United States Patent
Stuber et al.

(10) Patent No.: US 9,802,233 B2
(45) Date of Patent: Oct. 31, 2017

(54) GOLD EVAPORATIVE SOURCES WITH REDUCED CONTAMINANTS AND METHODS FOR MAKING THE SAME

(71) Applicants: Wendell R. Stuber, Pine Bush, NY (US); Ernesto Aviles, Monroe, NY (US); Jaydeep Sarkar, Thiells, NY (US); Paul S. Gilman, Suffern, NY (US)

(72) Inventors: Wendell R. Stuber, Pine Bush, NY (US); Ernesto Aviles, Monroe, NY (US); Jaydeep Sarkar, Thiells, NY (US); Paul S. Gilman, Suffern, NY (US)

(73) Assignee: Praxair S. T. Technology, Inc., North Haven, CT (US)

( * ) Notice: Subject to any disclaimer, the term of this patent is extended or adjusted under 35 U.S.C. 154(b) by 660 days.

(21) Appl. No.: 14/266,975

(22) Filed: May 1, 2014

(65) Prior Publication Data

US 2015/0315696 A1    Nov. 5, 2015

(51) Int. Cl.
*B21C 1/00* (2006.01)
*C22B 3/00* (2006.01)
(Continued)

(52) U.S. Cl.
CPC .................. *B21C 1/00* (2013.01); *B08B 3/08* (2013.01); *B08B 3/10* (2013.01); *B08B 3/12* (2013.01);
(Continued)

(58) Field of Classification Search
CPC ......... C22C 14/00; C22C 14/14; C22C 14/24; C22C 14/564; C22C 5/02; C22B 11/00;
(Continued)

(56) References Cited

U.S. PATENT DOCUMENTS

| 3,676,214 | A | * | 7/1972 | English et al. | ........ | B21K 23/00 |
| | | | | | | 29/90.01 |
| 4,066,819 | A | * | 1/1978 | Anderson | ............... | B32B 15/04 |
| | | | | | | 420/507 |

(Continued)

OTHER PUBLICATIONS

Cheng, Kezia. "Electron Radiation as an Indicator of Gold Nodule Defect During E-Beam Evaporation". Skyworks Solutions, Inc. Woburn MA. CS MANTECH Conference, May 16-19, 2011, Palm Springs, California.*

(Continued)

*Primary Examiner* — Kaj K Olsen
*Assistant Examiner* — Alexandra M Moore
(74) *Attorney, Agent, or Firm* — Nilay S. Dalal

(57) ABSTRACT

A unique sequence of steps is provided to reduce contaminants along one or more surfaces and faces of gold evaporative sources without deleteriously impacting the structure of the gold evaporative sources. Edges are deburred; contaminants are successfully removed therealong; and surface smoothness is substantially retained. The resultant gold evaporative source is suitable for use in evaporative processes as a precursor to gold film deposition without the occurrence or a substantial reduction in the likelihood of spitting by virtue of significantly reduced levels of contaminants, in comparison to gold evaporative sources subject to a standard cleaning protocol.

9 Claims, 10 Drawing Sheets

Cylindrical Surfaces After Slurry Vibratory Polishing and After Boiling Nitric Acid Leaching (51) Int. Cl.

| | | |
|---|---|---|
| *C23C 14/24* | (2006.01) | |
| *B21C 47/02* | (2006.01) | |
| *B08B 3/08* | (2006.01) | |
| *B08B 3/12* | (2006.01) | |
| *B08B 3/10* | (2006.01) | |
| *B24B 39/00* | (2006.01) | |
| *C23C 14/14* | (2006.01) | |
| *C23C 14/56* | (2006.01) | |
| *C22C 5/02* | (2006.01) | |
| *C23G 1/10* | (2006.01) | |
| *C22B 9/14* | (2006.01) | |
| *B24B 31/06* | (2006.01) | |

(52) U.S. Cl.
CPC .............. *B21C 1/003* (2013.01); *B21C 47/02* (2013.01); *B24B 31/06* (2013.01); *B24B 39/00* (2013.01); *C22B 9/14* (2013.01); *C22B 11/04* (2013.01); *C22C 5/02* (2013.01); *C23C 14/14* (2013.01); *C23C 14/24* (2013.01); *C23C 14/564* (2013.01); *C23G 1/10* (2013.01)

(58) Field of Classification Search
CPC ........... C22B 11/04; C22B 9/14; B24B 39/00; B24B 31/06; B21C 47/02; B21C 1/00; B21C 1/003; B22D 11/00; B22D 11/001; B22D 11/005; A44C 27/00; A44C 27/001; B08B 3/00; B08B 3/04; B08B 3/042; B08B 3/044; B08B 3/08; B08B 3/10; B08B 3/102; B08B 3/106; B08B 3/12; B08B 7/00; B08B 7/02; B01F 11/00; B01F 11/02; B01F 11/007; B01F 11/008; C21D 7/08
See application file for complete search history.

(56) References Cited

U.S. PATENT DOCUMENTS

| | | | |
|---|---|---|---|
| 4,080,485 A * | 3/1978 | Bonkohara | C22C 5/02 148/DIG. 20 |
| 4,153,523 A | 5/1979 | Koontz et al. | |
| 4,167,341 A * | 9/1979 | Doyel | B08B 3/12 134/118 |
| 4,330,920 A | 5/1982 | Killpatrick et al. | |
| 4,595,421 A | 6/1986 | Redhead et al. | |
| 4,775,512 A * | 10/1988 | Fukui | C22C 5/02 420/507 |
| 4,933,023 A | 6/1990 | Wahlbeck | |
| 5,927,131 A | 7/1999 | Kiuchi et al. | |
| 6,123,786 A * | 9/2000 | Uchiyama | A44C 27/003 148/430 |
| 6,376,104 B1 | 4/2002 | Li et al. | |
| 6,696,756 B2 * | 2/2004 | Chang | H01L 24/43 174/126.2 |
| 7,871,563 B2 | 1/2011 | Acker et al. | |
| 8,101,123 B2 | 1/2012 | Lee | |

OTHER PUBLICATIONS

DGR Industrial Products. "Analyzing Precious Metals For Content & Purity". pp. 1, 11. www.chemical-supermarket.com/files/TestingPreciousMetalsFirstPrinting.pdf. (2012).*

Campbell, Stephen A. "The Science and Engineering of Microelectronic Fabrication", 12.4 Evaporator Systems: Crucible Heating Techniques, Oxford University Press, Inc., New York, New York, (1996) pp. 289-291.

* cited by examiner

Cylindrical Surfaces After Slurry Vibratory Polishing

Cylindrical Surfaces After Slurry Vibratory Polishing and After Boiling Nitric Acid Leaching

Fig. 9(a) Std Product –
Curved Face (100x)

Fig. 9(b) Std Product –
Flat face (100x)

Fig. 10(a) Improved Product –
Curved Face (100x)

Fig. 10(b) Improved Product –
Flat Face (100x)

GOLD EVAPORATIVE SOURCES WITH REDUCED CONTAMINANTS AND METHODS FOR MAKING THE SAME

FIELD OF THE INVENTION

The present invention relates to gold evaporative sources with reduced residual surface contaminants and a unique method for removing such contaminants.

BACKGROUND OF THE INVENTION

Figure 1:
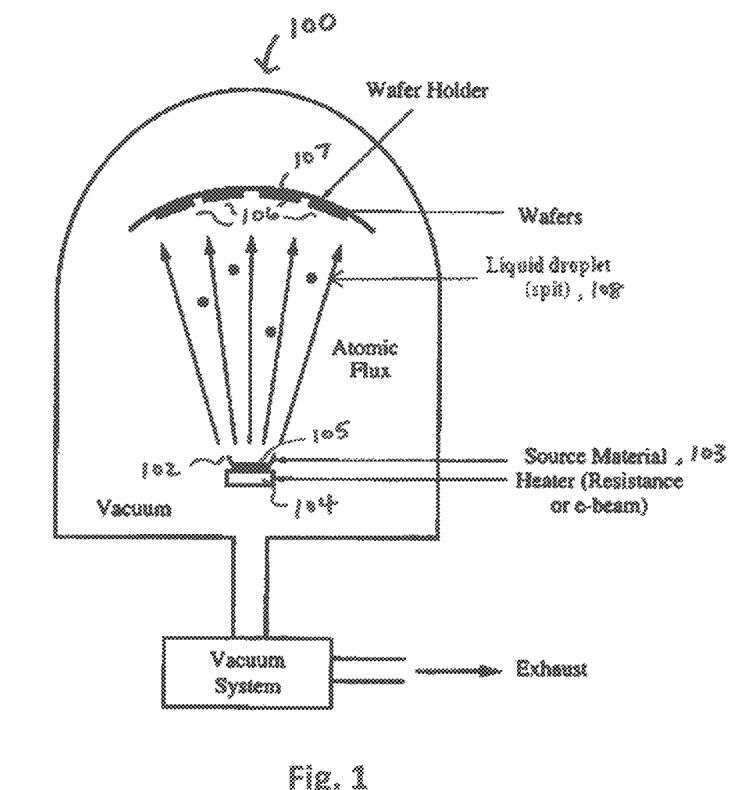
FIG. 1 shows an evaporative process for depositing thin-films of gold.

Evaporation is a thin-film deposition process utilized for creating thin-film layers of gold onto a wafer. FIG. 1 shows a representative example of an evaporative process 100 for depositing thin-film layers of gold. The tool utilized in the process 100 is commonly referred to as a planetary evaporation tool 101. Solidified gold material 102 (refer to hereafter as a "gold evaporative source") is placed in a crucible 103. Electron beam or resistance heating elements can serve as the heat source 104 to melt the gold evaporative source 102. The melting of the gold evaporative source 102 creates a liquid pool 105 as shown in FIG. 1. The gold evaporative source in molten form is further heated until vaporization occurs. The gold vapor traverses upwards within the interior of the tool 101, and ultimately condenses and deposits as a thin-film onto one or more surfaces of a series of wafers 106, each of which is shown situated on a wafer holder 107. In this manner, one or more layers of the gold from evaporation source 102 may be deposited on the wafers 106.

The evaporative process 100 occurs under vacuum conditions and within a prescribed range of operating parameters. Operating parameters such as power input, crucible liner, heat transfer and deposition rate may be monitored and adjusted if necessary to ensure they remain within target set point ranges. There are instances during the evaporative process 100 when the deposition rate may gradually ramp down or sharply decrease below its target set point range. In order to compensate for the reduced deposition rate, the power of the tool is typically increased. However, oftentimes, the increased power imparted to the tool 101 and heat sources 104 can substantially alter the boiling characteristics of the gold evaporation source 102 such that it attains a vigorous and high-energy state. The boiling at the increased power levels can be associated with a rapidly moving or turbulent molten liquid pool, particularly at the free surface. Depending upon the severity of the molten pool turbulence, molten gold liquid can be inadvertently ejected from the crucible towards the wafers 106 in the form of liquid droplets 108, as shown in FIG. 1. This phenomenon is known as "spitting" and is recognized as detrimental to film quality by virtue of the creation of in-film defects known as nodules or particles contained or embedded within the deposited gold film. Such nodules are further problematic as they can significantly lower production yields and lead to device malfunction by a breakdown of the layered structures of the device.

The phenomenon for spitting is not entirely understood, but is believed to be attributed, at least in part, to the conditions and parameters of the process 100, which if left uncontrolled, has the potential to influence the likelihood of spitting. In this regard, conventional means for overcoming spitting has involved adjusting several parameters, including controlling power input to the tool 101; controlling heat transfer to the solidified gold material 102; and selection of a suitable liner material or the crucible 103. Although such process conditions and parameters can be adjusted, spitting remains a prevalent problem during the gold evaporative process 100. Additionally, end-users are often limited in their degree of freedom to alter conditions and parameters from established set points or target values. Generally speaking, in the microelectronics industry, because the source tools have previously been qualified to operate at established processing parameters which have demonstrated the ability to precisely and reliably produce acceptable wafers with the required thin-film layers of deposited gold, the processing parameters preferably are to remain unchanged when performing the evaporative process 100.

As an alternative or in addition to varying process conditions, end-users have utilized a gold evaporation source having a purity of at least 99.999% to prevent spitting. However, the problem of inadvertent liquid droplet ejection from the crucible still occurs.

In view of the on-going challenges, there remains an unmet need for a gold evaporative process that overcomes spitting and is capable of producing gold films without in-film defects.

SUMMARY OF THE INVENTION

The invention may include any of the following aspects in various combinations and may also include any other aspect of the present invention described below in the written description.

In a first aspect, a gold evaporative source with reduced surface contaminants is provided that is prepared by a process comprising the steps of: providing a predetermined volume of gold evaporative sources, each consisting essentially of at least 99.999 wt % gold (5N Au), and further wherein each gold evaporative source is characterized by one or more surfaces extending between a first face and a second face; burnishing the gold evaporative sources against each other in the presence of a liquid slurry at ambient temperature under a controlled vibratory action, thereby loosening and removing at least a portion of contaminants along at least one of the first face, the second face and the one or more surfaces to form a partially cleaned gold evaporative source; followed by leaching the partially cleaned gold evaporative sources with boiling nitric acid to dislodge and remove contaminants along at least one of the first face, the second face or the one or more surfaces without substantially altering the surface roughness along the one or more surfaces, the first face, and the second face.

In a second aspect, a method for making gold evaporative sources with reduced surface contaminants comprising: providing a cast billet consisting essentially of at least 99.999 wt % gold (5N Au); subjecting the cast billet to one or more metal forming operations whereby a cross sectional diameter of the cast billet is reduced to create drawn wire; coiling the drawn wire; slicing the drawn wire to form gold evaporative sources each of which is characterized by one or more surfaces extending between a first face and a second face; burnishing the gold evaporative sources against each other in the presence of a liquid slurry at ambient temperature under a controlled vibratory action, thereby loosening and removing at least a portion of contaminants along at least one of the first face, the second face and the one or more surfaces to form a partially cleaned gold evaporative source; and leaching the partially cleaned gold evaporative sources with boiling nitric acid to dislodge and remove contaminants along at least one of the first face, the second face or the one or more surfaces without substantially altering the surface roughness along the one or more surfaces, the first face, and the second face.

A method of reducing contaminants from a gold evaporative source, comprising the steps of: providing sliced gold evaporative sources each of which is characterized by one or more surfaces extending between a first face and a second face; burnishing the gold evaporative sources against each other in the presence of a liquid slurry at ambient temperature under a controlled vibratory action, thereby loosening and removing at least a portion of contaminants along at least one of the first face, the second face and the one or more surfaces to form a partially cleaned gold evaporative source; and leaching the partially cleaned gold evaporative sources with boiling nitric acid to dislodge and remove contaminants along at least one of the first face, the second face or the one or more surfaces to create one or more leached surfaces without substantially altering the surface roughness of the one or more leached surfaces.

BRIEF DESCRIPTION OF THE DRAWINGS

The objectives and advantages of the invention will be better understood from the following detailed description of the preferred embodiments thereof in connection with the accompanying figures wherein like numbers denote same features throughout and wherein.

DETAILED DESCRIPTION OF THE INVENTION

The objectives and advantages of the invention will be better understood from the following detailed description of the preferred embodiments thereof in connection. The present disclosure relates to a unique sequence of steps utilized to reduce contaminants along one or more edges, surfaces and faces of gold evaporative sources without deleteriously impacting the structure of the gold evaporative sources. The cleaned gold evaporative sources reduce the phenomena of spitting during evaporation in the planetary evaporation tool. The disclosure is set out herein in various embodiments and with reference to various aspects and features of the invention.

"Conventional gold evaporative sources" as used herein refers to those evaporative sources not subject to the methods of the present invention and which contain sufficiently elevated amounts of carbon and other contaminants prone to spitting during the evaporation process, such as that representatively illustrated in FIG. 1.

The relationship and functioning of the various elements of this invention are better understood by the following detailed description. The detailed description contemplates the features, aspects and embodiments in various permutations and combinations, as being within the scope of the disclosure. The disclosure may therefore be specified as comprising, consisting or consisting essentially of, any of such combinations and permutations of these specific features, aspects, and embodiments, or a selected one or ones thereof.

The present invention has recognized a correlation between the amount of surface contaminants of gold evaporative sources and the occurrence of spitting. Increased levels of contaminants along the gold evaporative sources have been discovered to increase the tendency for ejection of liquid droplets from the melt pool contained within the crucible. The exact mechanism is not understood. However, without being bound by any particular theory, during the evaporative process, surface contaminants are melted to form part of the melt pool. The surface of the melt pool tends to accumulate carbon and potentially other contaminants, all of which entirely conceals or substantially reduces the free surface area of the melt pool. The accumulation of contaminants reduces the free surface area of the melt pool. As a result, less gold can evaporate from the free surface, thereby reducing the deposition rate of the gold onto the wafers. To compensate for the reduced deposition rate, end-users generally increase the power of the tool. However, the increased power leads to vigorous boiling whereby rapidly moving or turbulent molten liquid pool, particularly at the free surface, attains an energy state sufficiently high to cause ejection of liquid droplets from the crucible and thereafter trajectory towards the wafers.

The present invention deviates from standard practice, which has generally focused on systems and processes that achieve greater control of heat transfer to the gold evaporative sources. Rather than focus on the evaporative process or associated tooling and equipment employed in the process, the present invention implements a cleaning process which has a combination of specific steps arranged in a certain sequence to reduce surface contaminants along one more of the gold evaporative surfaces, faces and edges of the gold evaporative sources. Each of the cleaning steps removes contaminants in different magnitudes along various locations of the sources, and also facilitates the loosening or dislodging of contaminants which are tightly adhered onto or embedded at surfaces of the sources. In this manner, the combination of steps interacts with each other in a compatible and synergistic manner to create a final gold evaporative source with reduced surface contaminants. The inventive steps in specific combination also advantageously deburr edges between the surfaces and flat faces as will be described. The overall structure of the gold evaporative sources is not deleteriously affected by the inventive cleaning steps and material loss is minimal or entirely avoided. The gold evaporative sources subject to the cleaning methodology of the present invention have a substantially reduced tendency to produce spits in the form of liquid droplets, which can produce in-film defects.

The working examples, as will be discussed below, demonstrate that the gold evaporative sources subject to the present invention have significantly lower contamination in comparison to conventional gold evaporative sources as a result of surfaces characterized by scanning electron microscopy ("SEM") and energy dispersive x-ray analysis ("EDAX") results.

Figure 2:
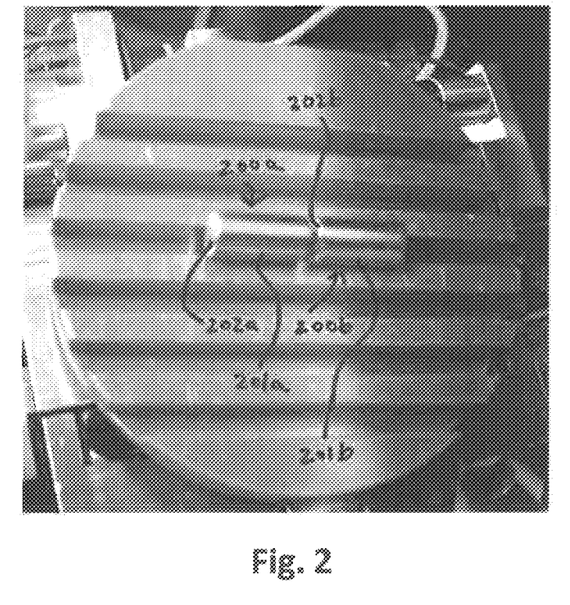
FIG. 2 shows a macro-photograph of two typical gold evaporative sources and their cylindrical shape.

FIG. 2 shows two examples gold evaporative sources 200a and 200b, each of which is 99.999 wt % purity (5N) and generally cylindrical-shaped. Preferably, the present invention is directed to purity levels of at least 5N, as less pure material can contribute to increased amounts of surface contaminants which may contribute to formation of liquid droplets during evaporative processing. Source 200a has two faces designated as 202a, and surface 201a extends between the faces 202a. Similarly, source 200b has two faces 202b, and surface 201b extends between the faces 202b. The sources 200a and 200b have a diameter of about 0.25 inches and a length of about 0.5 inches, both of which are typical for evaporative sources. However, it should be understood that other dimensions are contemplated by the present invention as well as other shapes, such as, by way of example and not intending to be limiting in any aspect, rectangular-shaped or polygonal shaped gold evaporative sources.

Figure 3A:
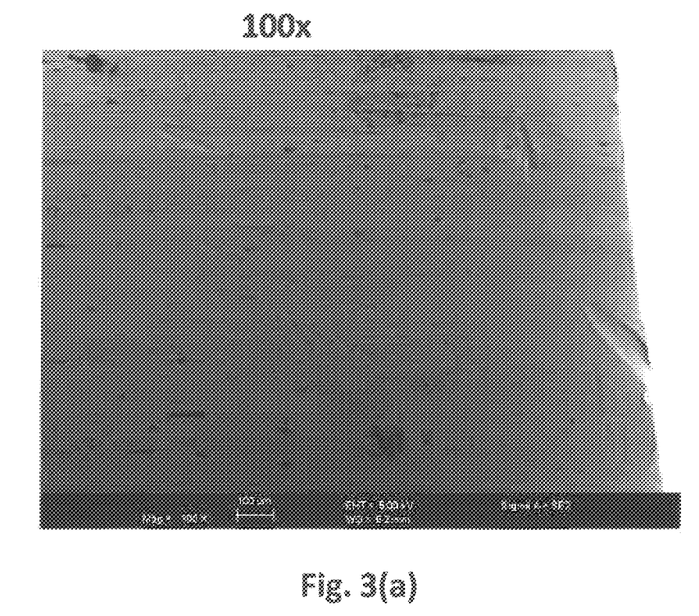
FIGS. 3a and 3b show SEM images at 100× magnification along the surface and edges, respectively of as-sliced evaporative sources prior to cleaning.
Figure 3B:
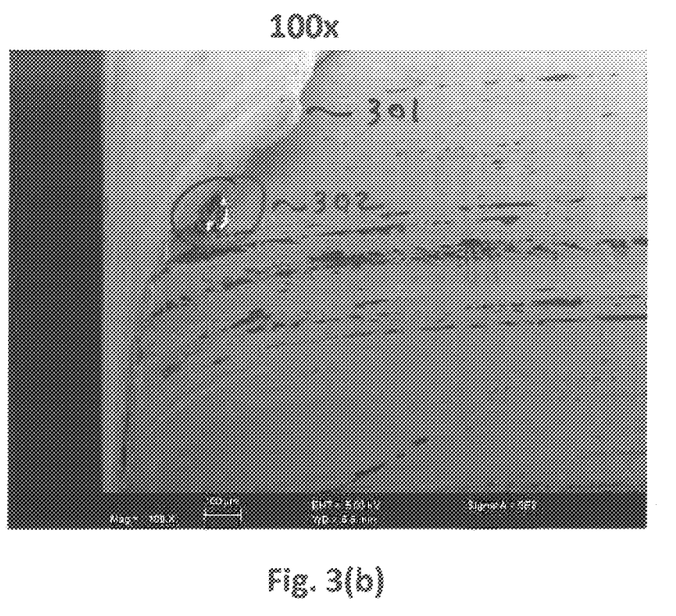

The sources 200a and 200b have undergone a fabrication process involving casting to billet and subsequent metal forming operations followed by slicing to achieve the resultant shape and dimensions as shown in FIG. 2. Each of the fabrication steps imparts contaminants, including carbon, oxygen, magnesium and silicon. It should be understood that the present invention contemplates any number of process routes for fabricating the gold evaporative source into a resultant shape and size. Carbon contamination is generally the most abundant of the contaminants and contained in the highest amounts along surfaces and faces of the gold evaporative sources 200a and 200b. Carbon particles accumulate during each of the fabrication steps of the gold evaporative sources 200a and 200b. As fabrication continues, carbon particles have a tendency to agglomerate and become embedded and preferentially locked into surfaces 201a and 201b and/or flat faces 202a and 202b. Furthermore, the carbon particles tend to segregate at preferential locations. By way of example, FIGS. 3a and 3b show SEM images at 100× magnification along the surface and edges, respectively, of as-sliced evaporative sources prior to cleaning. During fabrication of the sources 200a and 200b, the slicing of the coiled wire into the resultant size and shape tends to introduce a large amount of embedded carbon along the edges 301 as shown in FIG. 3b. Region 302 is representative of the types of embedded carbon particles that conventional cleaning techniques cannot remove. Other contaminants are also shown contained along crevices and flow lines, both of which are invariably formed during various metal forming steps such as swaging, drawing and extrusion, as will be described in greater detail below. As can be seen, the nature of the tightly adhered and embedded contaminants, particularly carbon, has created challenges to achieving gold evaporative sources with reduced contaminant levels not susceptible to spitting.

Figure 4A:
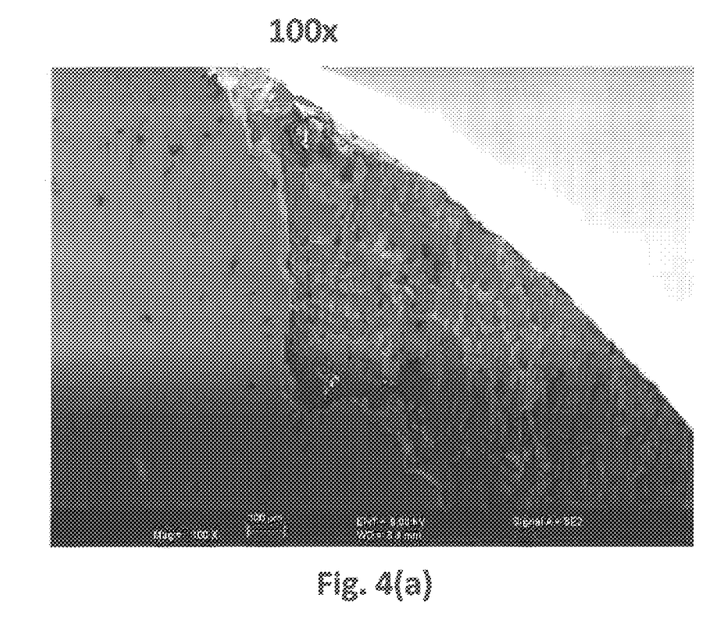
FIGS. 4a and 4b show SEM images at 100× and 1000× magnification, respectively, along the flat surfaces of as-sliced evaporative sources prior to cleaning.
Figure 4B:
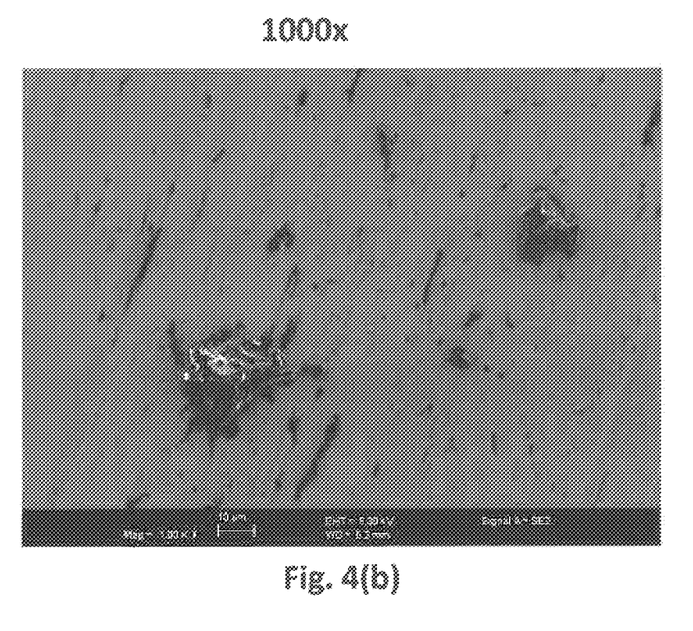

FIGS. 4a and 4b show SEM images at 100× and 1000× magnification, respectively, along the flat surfaces of the as-sliced evaporative sources of FIGS. 3a and 3b prior to cleaning. Segregation and accumulation of carbon and foreign materials are clearly observed to be embedded along the flat faces, and the edges between the flat faces and surfaces. If not satisfactorily removed, the contaminants are believed to be precursors to the spitting phenomenon.

The present invention involves a counterintuitive burnishing and deburring step followed by a leaching step to significantly reduce the level of contaminants. Prior to employing the inventive cleaning steps, the as-sliced gold evaporative sources are preferably immersed in an industrial grade detergent cleaning solution to remove loosely held contaminants. Loosely held contaminants include carbon and other types of foreign materials which are neither tightly adhered onto the cylindrical surfaces/flat faces nor embedded therein. Any suitable industrial grade detergent can be employed such as, by way of example and not intending to be limiting, CRC Hydroforce degreaser. Immersion of the gold evaporative sources may occur for any duration. In one example, the gold evaporative sources are immersed for about 30-40 minutes and then rinsed with water, preferably deionized water, and then dried with acetone.

Figure 5:
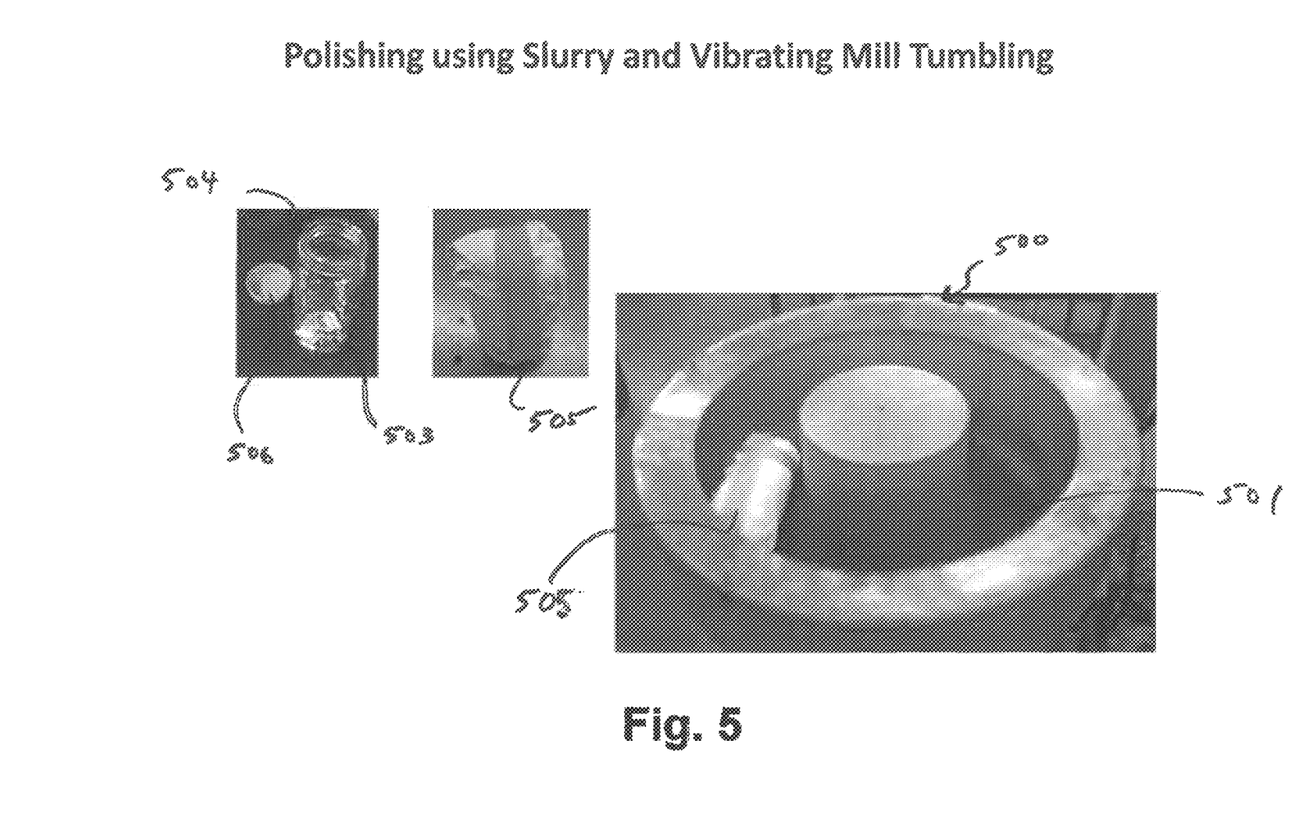
FIG. 5 shows an example of vibratory tumbling mill for slurry polishing and deburring gold evaporative sources in accordance with principles of the present invention.

Having removed the loosely held contaminants, the burnishing step can be employed in accordance with the principles of the present invention. The burnishing step involves a slurry vibratory polishing of the cylindrical surfaces and flat faces in combination with removal and loosening of at least a portion of contaminants. The cylindrical surfaces and flat faces of the gold evaporative sources are cleaned in the presence of a liquid slurry under simultaneous controlled mechanical agitation. The agitation is performed under vibratory motion at a predetermined frequency. In this regard, FIG. 5 shows an exemplary vibratory tumbling mill 500 for performing the slurry polishing and deburring of gold evaporative sources 503 in accordance with the principles of the present invention. The gold sources 503 are placed into a non-plastic container 504 (e.g., glass jar). A suitable polishing slurry is introduced into the container 504. Preferably, the slurry is #2 Liquid Burnisher, commercially available from Ultramatic Equipment Co. The burnishing compound is diluted with water, preferably in a volume ratio of about 3:1. Other commercial liquid burnishers may also be utilized. The polishing slurry with gold evaporative sources therein are enclosed with a lid 506 and then wrapped with a cloth 505 to ensure the glass container 504 does not crack or shatter during the mechanical agitation. The sealed and wrapped container 504 is placed within the annular region 501 of the vibratory tumbling mill 500. A frequency agitation is maintained in a range from 1000 min$^{-1}$ to 1500 min$^{-1}$ for a duration of about 30 minutes or less to create controlled agitation of the gold evaporative sources 503 within the non-plastic container 504. The exact time of agitation depends at least in part on the volume of the gold evaporation sources being subject to the vibratory polishing. The agitation of the mill 500 creates a rubbing action of the polishing slurry against the surfaces and edges to allow loosening and removal of embedded contaminants such as carbon. Additionally, the gold evaporative sources 503 collide with each other in a manner to facilitate in the removal and loosening of such embedded contaminants. The mechanical agitation also enables edges between the surfaces and flat faces to be deburred and smoothened as a result of the gold evaporative sources 503 colliding with each other within the container 504 during the vibratory motion of the tumbling mill 500.

Figure 6A:
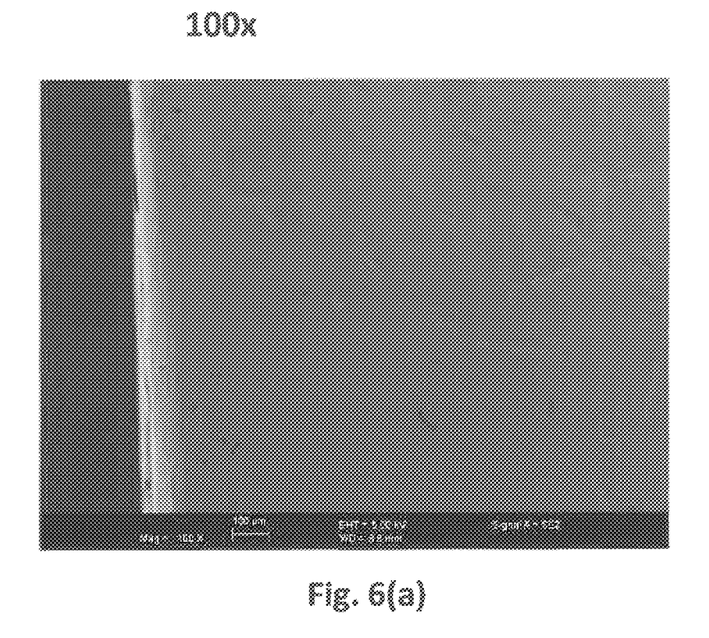
FIGS. 6a and 6b show results of the vibratory polishing in the tumbling mill along the cylindrical surfaces at 100× magnification whereby a partially cleaned gold evaporative source is produced.
Figure 6B:
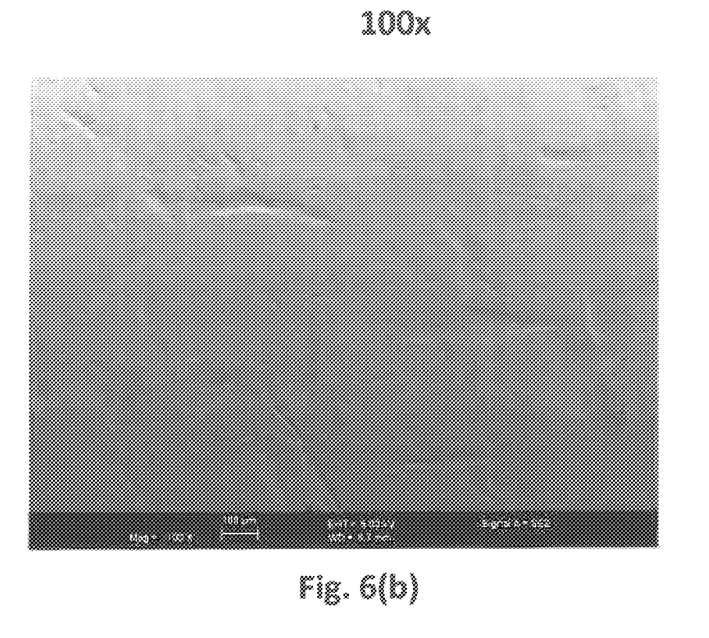

Results of the vibratory polishing are shown in FIGS. 6a, 6b, 7a and 7b. FIG. 6a shows the cylindrical surface of the gold evaporative source along the edge region. FIG. 6b shows the cylindrical surface extending away from the edge.

Figure 7A:
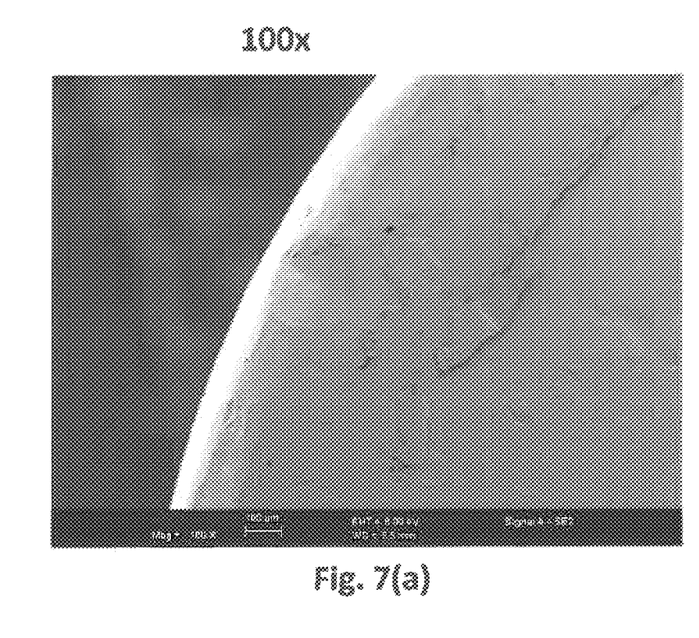
FIGS. 7a and 7b show results of the vibratory polishing in the tumbling mill along the flat surfaces at 100× and 500× magnification, respectively whereby a partially cleaned gold evaporative source is produced.
Figure 7B:
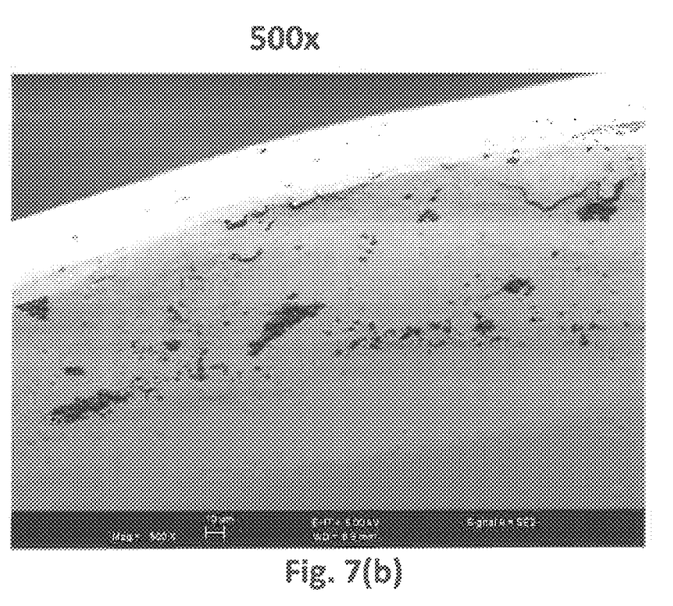

Substantial reduction of carbon and other foreign materials have occurred in comparison to FIGS. 3a and 3b. FIGS. 7a and 7b shows the flat surfaces along the edges at a magnification of 100× and 500×, respectively. Substantial reduction of carbon and other foreign materials have occurred in comparison to FIGS. 4a and 4b. The burnishing is evident along certain regions of the flat faces where folds have occurred as a result of plastic deformation therealong. The flat faces are partially texturized so as to reduce contaminants, particularly the amount of embedded contaminants, such that a partially cleaned gold evaporative source is formed. Surprisingly, the burnishing step produces unexpectedly cleaner surfaces without degrading the mechanical integrity of the gold evaporative sources when the frequency of agitation is in the range from 1000 $min^{-1}$ to 1500 $min^{-1}$ for a duration of about 30 minutes or less. In this regard, the burnishing step utilized by the present invention is a counterintuitive approach for reducing embedded contaminants not previously utilized or recognized as a viable means for cleaning gold evaporative cylindrical surfaces, flat faces and edges. The inventive vibratory slurry polishing involves the ability to loosen and remove carbon and other foreign particles around the edges while also smoothening or roundening any jagged edges formed during slicing of the coiled wire by a deburring or rubbing mechanism not previously attainable with conventional techniques.

The slurry vibratory polishing also involves dislodging and loosening of many of the embedded particles along the various surfaces and edges, which can be removed in their entirety by the subsequent leaching step.

After the vibratory polishing step is completed, the partially cleaned gold evaporative sources are soaked in deionized water and rinsed therein to remove any residual slurry. An acetone wash may also be utilized to remove soluble organic residues from the gold cylindrical surfaces and flat faces and edges.

The gold evaporative sources are now subject to boiling nitice acid leaching in accordance with the principles of the present invention. The nitric acid is able to penetrate under the contaminants particles which have been at least partially loosened and dislodged by the previous vibratory polishing and slurry. The exact duration for leaching depends at least in part on the volume of the partially cleaned gold evaporative sources being processed.

Figure 8A:
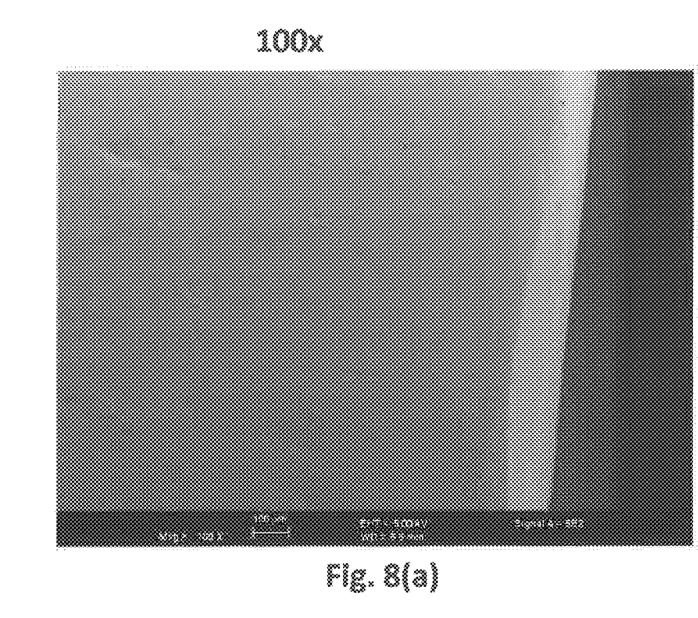
FIGS. 8a-8d show results of the nitric acid leaching along the cylindrical and flat surfaces to produce the gold evaporative source with reduced surface contaminants.
Figure 8B:
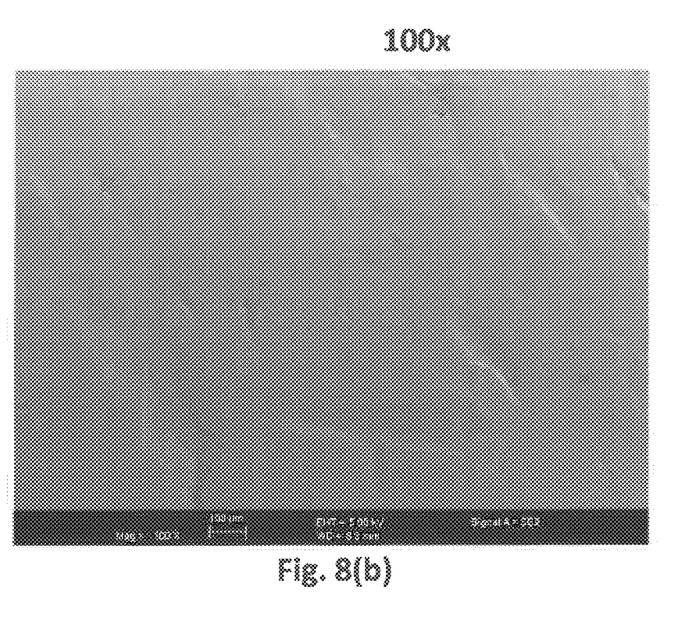
Figure 8C:
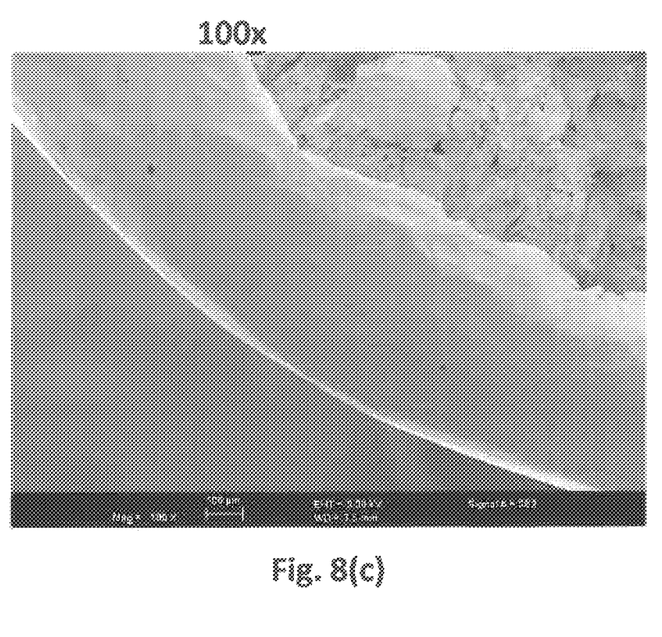
Figure 8D:
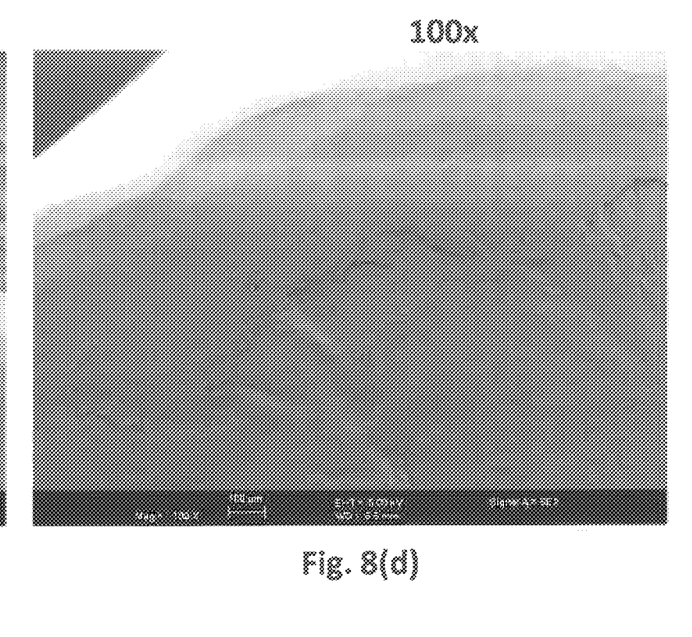

FIGS. 8a and 8b show results of the nitric acid leaching along the cylindrical surfaces. FIGS. 8c and 8d show results of the nitric acid leaching along the flat faces and edges. The Figures show that surface smoothness is substantially retained. Gold evaporative sources with reduced surface contaminants are achieved after the nitric acid leaching whereby surface cleanliness is improved. The amounts of embedded contaminants are reduced along the cylindrical surfaces, flat surfaces and edges, and particularly in the direction of the flow lines created during metal forming.

Selection of nitric acid in its boiling state as a leachant, for reasons which are not known or fully understood, provide the optimal level of acidity so as to achieve the greatest reduction in contaminants without deleteriously affecting surface morphology or structural integrity of the gold evaporative sources. The surface morphology is clear and the structure remains substantially unaltered from the vibratory polishing. On the other hand, utilizing HCl as the leachant did not achieve the same level of cleanliness. Similarly, the use of a mixture of HCl and $HNO_3$ (i.e., aqua regia) at elevated temperature for gold evaporative sources, while considered a stronger and more vigorous etchant than $HNO_3$, surprisingly does not remove as many carbon particles as the HNO3. While the exact mechanism is not known, utilizing HCl or aqua regia may be causing the carbon particles to resettle onto the surfaces and edges of the gold evaporative sources, as evident by SEM detection. Further, the aqua regia has a tendency to create excessive surface roughening (i.e., numerous peaks and valleys along the surfaces) and incomplete cleanliness along the surfaces. Nitric acid in a boiling state has been discovered to behave as a suitable leachant capable of optimal performance with regards to achieving acceptable cleanliness without deleteriously impacting morphology or structural integrity of the gold evaporative sources. Unlike aqua regia and HCl, utilizing boiling nitric acid dislodges both large and small carbon particles from the gold surface without incurring a measurable loss of gold. Without being bound by any particular theory or mechanism, the nitric acid may not deleteriously affecting surface morphology or structural integrity of the gold evaporative sources by virtue of minimum dissolution of gold into the nitric acid. Further, the boiling nitric acid leaches in a manner that most likely penetrates the contact area between carbon and foreign particles and the gold surface so as to dislodge these particles and achieve successful removal from the gold surfaces in manner that does not disrupt the underlying gold surfaces. Although the exact mechanism of particle removal is not known or understood with certainly, the beneficial effects of utilizing boiling nitric acid as a leachant are visible from the results (FIGS. 8a-8d).

Another attribute which makes nitric acid a preferred leachant of choice for gold materials is its nitrate forming capability. Nitric acid can easily form water soluble nitrate of various metals which can effectively reduce levels of metallic contaminants during leaching and following deionized water washing steps. Accordingly, the selection of nitric acid with gold as a suitable leachant is based upon several criteria, including nitrate forming capability and the ability to remove contaminant particles without substantially altering or degrading the surface morphology or structural integrity of the surfaces of the gold evaporative sources.

It should be noted that leaching by itself will not be able to remove the embedded contaminants, particularly those along the edges. Applicants have discovered that vibratory slurry polishing is required before leaching to create the necessary deburrying action of the slurry vibratory polishing whereby edges tend to be smoothened. The nitric acid leaching does not provide the deburring action. Additionally, the vibratory polishing action loosens and dislodges embedded contaminants, which can subsequently be removed, without losing underlying gold material via dissolution of the gold in the presence of nitric acid leaching. In this regard, a sequence of steps has been discovered to synergistically interact each other to improve cleaning in a manner previously not attainable with conventional cleaning methodologies for gold evaporative sources.

At this stage of the cleaning process, the combination of slurry vibratory polishing with nitric acid leaching eliminates or removes a substantial portion of the embedded contaminant particles from the surfaces and edges. Any remaining portion of carbon or other foreign particles which were embedded into the surfaces are by this stage predominantly loosely held onto the surfaces of the gold evaporative sources. These remaining loosely held particles are readily detached by utilizing deionized water and an acetone rinse, both of which also lowers the pH of the surfaces of the gold surfaces to about 7 and dries the surfaces. The deionized water and acetone rinse eliminate the need for oven drying, which can introduce contaminant particles onto the cleaned surfaces and edges. The resultant cleaned gold evaporative sources in accordance with the principles of the present invention have surface contaminants which are significantly reduced to a level such that the phenomenon of spitting does not occur during the evaporative process.

It should be noted that prior cleaning methodologies have not been successful in removing embedded particles such as carbon particles that can become secured and locked into the surfaces and edges, particularly along flow lines created as a result of imparting metal forming steps to the gold evaporative sources. The flow lines are characterized by valleys and peaks that create anchoring points or nucleation sites for carbon particles to lock therein. The inventive cleaning process offers a novel slurry vibratory polishing followed by nitric acid leaching that enables at least a portion of the cleaning media to penetrate underneath the contaminant particles, thereby gradually loosening the carbon particles from the surfaces of the gold evaporates while substantially retaining the surface smoothness of the gold surfaces. By retaining a relatively smooth surface and deburring of the edges, contaminant particle segregation and settling along the roughened surfaces is inhibited by virtue of a reduction of roughened surfaces during the inventive process.

Packaging is carefully selected so as to not re-contaminate the surfaces. In a preferred embodiment, the cleaned gold evaporative sources are packaged into clean aluminum foils, preferably of industrial electronic grade. The aluminum foils are rinsed with deionized water and alcohol to rinse any contaminant particles which may be contained along portions of the aluminum foil. Plastic bag is avoided so as to avoid creation of surface blemishes and the reintroduction and accumulation of carbon from the plastic bag.

It should be noted that the slurry vibratory polishing followed by the nitric acid leaching are unique steps which are specifically compatible with gold evaporative sources. The slurry vibratory polishing deburs the edges while removing contaminants therealong and also simultaneously loosening and dislodging contaminants along the surface to enable removal by the subsequent nitric acid leaching treatment. The underlying mechanism for successful removal of contaminants without degradation of the structure of the gold evaporative sources is not known, but the visible results clearly show the efficacy of the cleaning methodology employed by the present invention. The specific sequence of steps is synergistic in relation to gold but may not be applicable to other materials. In this regard, the present invention can actually be detrimental to certain other types of metals, including particular precious metals whereby contaminants are not reduced to a sufficiently low enough level to eliminate spitting, and/or the cleaning media deleteriously impacts the structure, such as by occurrence of degradative reactions along the surfaces and edges. Additionally, the present invention is not applicable to other metals exhibiting variable malleability and hardness that is different from that of gold, as the extent of cleaning by slurry polishing and chemical reagents depends on the degree of hardness and chemical reactivity of the metals. Some metals can chemically react with the deburring slurry. For example, if a relatively soft metal is exposed to the deburring slurry of the present invention, excessive material loss and detrimental deburring is observed. However, surprisingly, under the specific conditions and steps of the present invention, gold does not appear to exhibit such negative reactivity. Accordingly, the nature of the specific metallic material and the reactivity of the metallic material with respect to the cleaning media do not render cleaning media and associated methods and process conditions of the present invention interchangeable with other media and cleaning methods.

The working examples below compared a conventional cleaning methodology with that of the present invention for reduction of surface contaminants along surfaces and edges of gold evaporative sources having a purity of 5N. It should be understood that the working examples are not intended in any way to limit the scope of the present invention, but rather are intended to illustrate principles of the present invention.

In both examples, cylindrical shaped gold evaporative sources were manufactured as shown in FIG. 2. Each of the sources had a diameter of 0.250 inches and a length of 0.5 inches. The cylindrical shaped gold evaporative sources were manufactured from a cast billet. The cast billet was subject to various metal forming steps whereby a cross-sectional diameter of the cast billet was reduced to produce wire. The first metal forming step that was employed was a swaging operation whereby repeated metal blows using multiple moving dies inside a roller cage were utilized. The billet was advanced through a series of dies having progressively smaller diameter. Each of the dies reciprocated back and forth in a hammer-like motion to impact the surface of the billet from all directions. As the billet emerged from the series of dies, an intermediate rod-like structure was produced. Next, the intermediate rod was subject to another metal forming operation involving drawing to further reduce the diameter. The drawing operation involved pulling the rod-like structure through a die to reduce the cross-sectional area and produce the final outer diameter of the wire. As the wire was drawn and emerged from the die, it was wrapped around a vertical cylinder. Next, the coiled wire was fed through a series of rollers to straighten the coiled wire. The straightened wire entered a slicer which sliced the wire into cylindrical shaped gold evaporative sources as shown in FIG. 2.

Although the semi-finished cylindrical shaped gold evaporative sources of FIG. 2 macroscopically appeared shiny, close examination of the as-sliced sources revealed excessive surface contaminants as shown in the SEM images of FIGS. 3a, 3b, 4a and 4b by virtue of the steps involved to transform the cast billet into sliced wire. Furthermore energy dispersive x-ray analysis ("EDAX") revealed several contaminants, the most abundant of which was carbon particles. Oxygen, silicon and magnesium as well as traces of other foreign contaminants were revealed by the EDAX analysis of the as-sliced sources. FIGS. 3a, 3b, 4a and 4b revealed that the contaminants were located along the cylindrical surfaces, flat surfaces and edges of the sources in the form of isolated particles, clusters, and elongated stringers oriented in the direction of the metal forming. It was also observed that the round edges of the gold evaporation sources appeared to be preferential nucleation sites for carbon segregation. The surface contamination was predominantly observed to be driven by the friction between the work-piece and the components of the metal forming operations as well as slicing equipment. Additionally, a relatively smaller portion of the contaminants originated from exposure of the gold evaporation sources to the environment and the storage materials.

COMPARATIVE EXAMPLE 1

The as-sliced gold evaporative sources shown in FIG. 2, and by SEM images in FIGS. 3a, 3b, 4a and 4b were subject to a conventional cleaning protocol. First, the as-sliced gold evaporative sources were immersed in an industrial grade detergent cleaning solution (CRC Hydroforce degreaser) commercially available for 30-45 minutes. Next, the sources were soaked and rinsed with deionized water to remove any residual constituents of the detergent cleaning solution. SEM and EDAX studies indicated that elevated levels of carbon and oxygen as well as sodium (presumably from the detergent) were present on the various surfaces and edges. SEM images indicated contaminant clusters irregularly distributed and segregated within various pockets throughout the sources.

The degreased sources were then etched in a concealed container with boiling aqua regia, which consisted of a mixture of hydrochloric acid and nitric acid in a volume ratio of 4:1 for a duration of approximately less than 1 minute.

The etched sources were washed with deionized water to lower the pH to 7 and remove any residues. The sources then placed on a clean tray and dried inside a heated oven for up to several minutes.

Figures 9A, 9B:
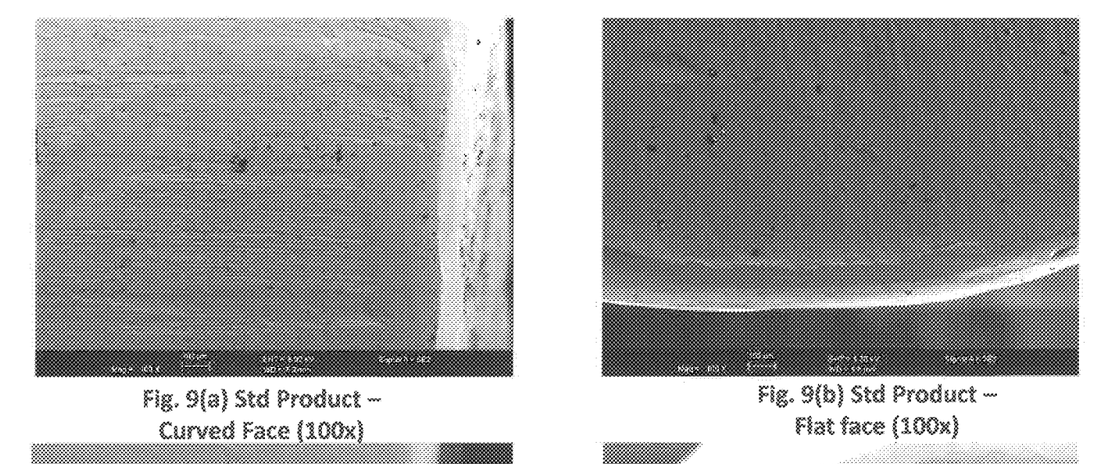
FIGS. 9a and 9b show results of a conventional cleaning methodology to produce the gold evaporative source with elevated levels of surface contaminants along the flat surface, edges and curved face.

The etching was observed to remove only larger carbon particles from the gold surfaces, and in doing so, at the expense of excessively roughening the surfaces and edges. The SEM images of FIGS. 9a and 9b show that the aqua regia etchant detrimentally increased roughness of the surfaces and edges. Further, unacceptably high levels of contaminants of carbon, and oxygen to a lesser degree along the flat faces, edges, and curved face were observed via SEM and detected by EDAX. It remained unclear how carbon levels remained elevated after the etching step.

The carbon particles distributed in the form of very small particles. The increased surface roughness imparted by the etching created nucleation sites which seemed to induce carbon segregation. Further problematic was the detectable loss of gold as a result of gold dissolution into the relatively strong acidic aqua regia mixture.

EXAMPLE 1

The as-sliced gold evaporative sources shown in FIG. 2, and by SEM images in FIGS. 3a, 3b, 4a and 4b were subject to a cleaning protocol in accordance with the principles of the present invention.

The gold evaporative sources were placed in a non-plastic container and then wrapped as shown in FIG. 5. The vibratory slurry polishing procedure as shown in FIG. 5 was utilized to remove surface contaminants and deburr and smoothen the edges, which are believed to act as preferential sites for carbon segregation. The vibratory polishing step involved usage of a liquid slurry (#2 Liquid Burnisher from Ultramatic Equipment Co.) and mechanical agitation within the vibratory tumbling mill of FIG. 5 at a frequency of 1000 $min^{-1}$. In addition to deburring, it was observed that the mechanical agitation dislodged and removed contaminants from the gold surfaces as a result of the rubbing action of neighboring gold evaporative sources. The vibratory tumbling mill was operated for approximately less than 30 minutes.

The gold evaporation sources were soaked in deionized water and rinsed in deionized water to remove residual slurry. An acetone wash was also used to remove any soluble organic residue from the gold surface prior to acid leaching.

SEM results at FIGS. 6a, 6b, 7a and 7b indicated substantial reduction of contaminant particles, aggregates and clusters from the edges, flat faces and curved faces in comparison to that of Comparative Example 1. Smoothened edges from the deburring action were also observed. EDAX results indicated reduced levels of carbon, oxygen, silicon and magnesium in comparison to that of Example 1. Carbon and foreign particles still remained as shown by FIGS. 7a and 7b along certain pockets of the periphery of the flat faces. However, the particles did not appear as tightly embedded as before the vibratory polishing step.

Next, the gold evaporative sources were leached by utilizing boiling nitric acid for approximately less than 40 minutes. Deionized water was used to bring the pH value of the solution down to 7 followed by an acetone rinse.

The sources were dried by alcohol soaking rather than oven drying. Alcohol drying occurred for about 5 minutes followed by drying at room temperature in a clean tray.

SEM images at FIGS. 8a-8d show that the remaining contaminant particles along the periphery of the flat faces were removed. Additionally, clusters and stringers of contaminants along the curved faces were removed. EDAX results indicated carbon, oxygen, silicon and magnesium were further reduced in comparison to those levels achieved after the slurry vibratory polishing but before the nitric acid leaching. Furthermore, surface smoothness remained substantially unaltered.

Figures 10A, 10B:
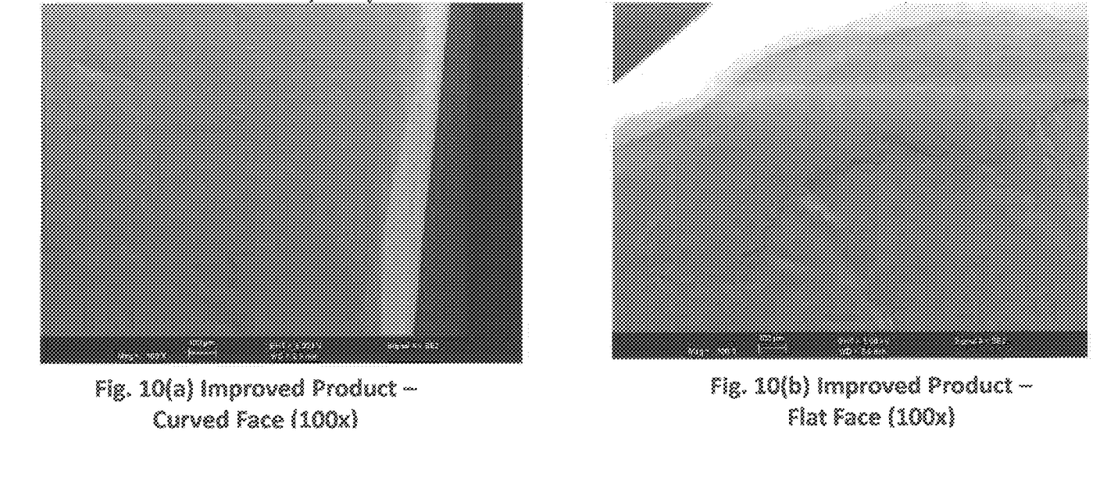
FIGS. 10a and 10b show results of the cleaning methodology in accordance with the principles of the present invention with significantly reduced levels of surface contaminants along the flat surface, edges and curved face.

FIGS. 10a and 10b show results of the cleaning methodology in accordance with the principles of the present invention with significantly reduced levels of surface contaminants along the flat surface, edges and curved face in a side-by-side comparison with the standard cleaning protocol of FIGS. 9a and 9b. The inventive protocol clearly reduced black spots (e.g., carbon contaminants) and created smoother edges and surfaces in comparison to results achieved by the standard protocol of FIGS. 9a and 9b.

While it has been shown and described what is considered to be certain embodiments of the invention, it will, of course, be understood that various modifications and changes in form or detail can readily be made without departing from the spirit and scope of the invention. For example, while many of the illustrated embodiments relate to 5N purity gold evaporative sources, it should be understood that the principles of the present invention are applicable to greater than 5N purity level gold evaporative sources as well as evaporative sources having varying geometries and shapes. It is, therefore, intended that this invention not be limited to the exact form and detail herein shown and described, nor to anything less than the whole of the invention herein disclosed and hereinafter claimed.

The invention claimed is:

1. A method for making gold evaporative sources with reduced surface contaminants comprising:
   providing a cast billet consisting essentially of at least 99.999 wt % gold (5N Au);
   subjecting the cast billet to one or more metal forming operations whereby a cross sectional diameter of the casted billet is reduced to create drawn wire;
   coiling the drawn wire;
   slicing the drawn wire to form gold evaporative sources each of which is characterized by one or more surfaces extending between a first face and a second face;
   burnishing the gold evaporative sources against each other in the presence of a liquid slurry at ambient temperature under a controlled vibratory action, thereby loosening and removing at least a portion of contaminants along at least one of the first face, the second face and the one or more surfaces to form a partially cleaned gold evaporative source; and
   leaching the partially cleaned gold evaporative sources with boiling nitric acid to dislodge and remove contaminants along at least one of the first face, the second face or the one or more surfaces without dissolution of the gold along the one or more surfaces, the first face, and the second face.

2. The method of claim 1, wherein the one or more metal forming operations comprises swaging the cast billet through a series of dies, each of which is characterized by a progressively smaller diameter to form an intermediate rod followed by drawing the intermediate rod through a die to produce drawn wire.

3. The method of claim 1, wherein the one or more metal forming operations comprises extruding the work-piece through a die followed by a drawing operation to produce drawn wire.

4. The method of claim 1, wherein the burnishing occurs in a vibratory mill tumbler configured to undergo vibratory motion at a predetermined frequency.

5. The method of claim 4, wherein a predetermined volume of the gold evaporative sources is mixed with a predetermined volume of the liquid slurry within a sealed non-plastic container that is configured to be shatter resistant during vibratory motion of the vibratory mill tumbler.

6. The method of claim 1, wherein said leaching is characterized by the absence of hydrochloric acid.

7. The method of claim 1, further comprising the step of drying leached gold evaporative sources, wherein said drying of leached gold evaporative sources is characterized by the absence of oven drying.

8. A method of reducing contaminants from a gold evaporative source, comprising the steps of:
   providing sliced gold evaporative sources each of which is characterized by one or more surfaces extending between a first face and a second face;
   burnishing the gold evaporative sources against each other in the presence of a liquid slurry at ambient temperature under a controlled vibratory action, thereby loosening and removing at least a portion of contaminants along at least one of the first face, the second face and the one or more surfaces to form a partially cleaned gold evaporative source; and
   leaching the partially cleaned gold evaporative sources with boiling nitric acid to dislodge and remove contaminants along at least one of the first face, the second face or the one or more surfaces to create one or more leached surfaces without dissolution of the gold.

9. The method of claim 8, wherein each of said burnishing and leaching further comprising the step of reducing the amount of carbon contaminant in comparison to a conventional gold evaporative source.

* * * * *